United States Patent [19]

Naruse et al.

[11] Patent Number: 5,356,821
[45] Date of Patent: Oct. 18, 1994

[54] METHOD FOR MANUFACTURING SEMICONDUCTOR INTEGRATED CIRCUIT DEVICE

[75] Inventors: Hiroshi Naruse, Kawasaki; Shin-ichi Taka, Yokosuka, both of Japan

[73] Assignee: Kabushiki Kaisha Toshiba, Kawasaki, Japan

[21] Appl. No.: 104,907

[22] Filed: Aug. 12, 1993

[30] Foreign Application Priority Data

Aug. 15, 1992 [JP] Japan .................. 4-238930

[51] Int. Cl.⁵ .......................................... H01L 21/265
[52] U.S. Cl. .................................. 437/34; 437/31;
437/99; 437/132; 437/162; 148/DIG. 9
[58] Field of Search ............... 437/31, 99, 131, 132,
437/162, 59; 148/DIG. 9

[56] References Cited

U.S. PATENT DOCUMENTS

| | | | |
|---|---|---|---|
| 4,879,255 | 11/1989 | Deguchi et al. | 437/99 |
| 5,059,544 | 10/1991 | Burghartz et al. | 437/99 |
| 5,250,448 | 10/1993 | Hamasaki et al. | 437/132 |

*Primary Examiner*—Tom Thomas
*Assistant Examiner*—Tuan Nguyen
*Attorney, Agent, or Firm*—Finnegan, Henderson, Farabow, Garrett & Dunner

[57] ABSTRACT

A semiconductor integrated circuit according to the present invention comprises a semiconductor substrate, a plurality of MOS field effect transistors each formed on a surface region of the semiconductor substrate and having source and drain regions, a gate insulating film formed on a region between the source and drain regions, and a gate electrode formed on the gate insulating film. The gate electrode includes a polycrystalline SiGe-mixed crystal which is expressed by $Si_{1-x}Ge_x$ $(1>x>0)$.

2 Claims, 7 Drawing Sheets

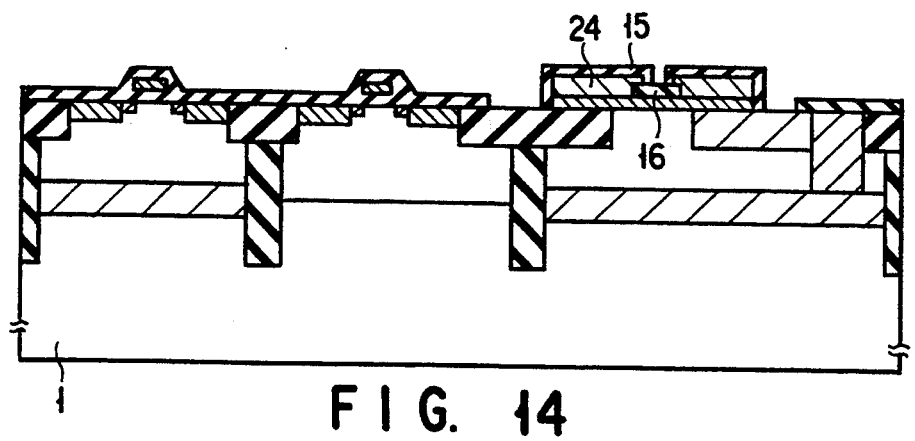
F I G. 14
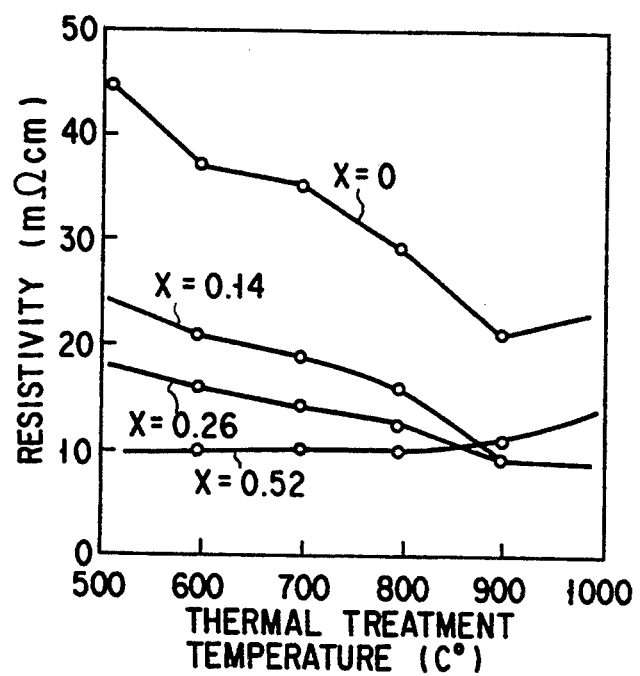
F I G. 15
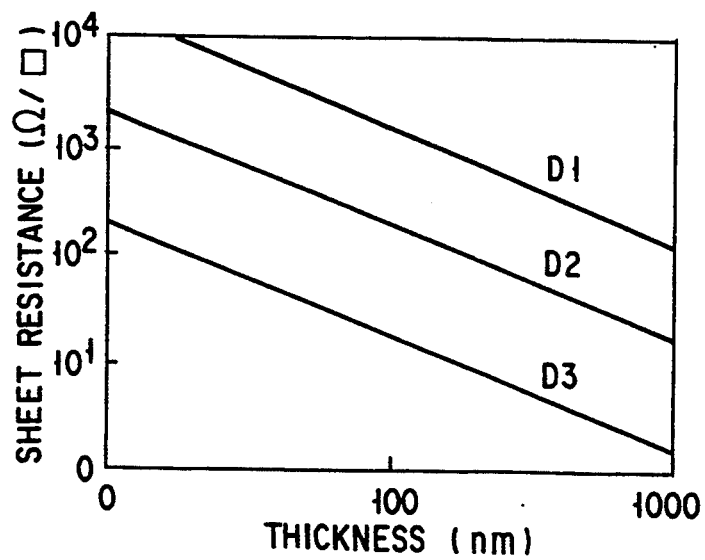
F I G. 16

METHOD FOR MANUFACTURING SEMICONDUCTOR INTEGRATED CIRCUIT DEVICE

BACKGROUND OF THE INVENTION

1. Field of the Invention

The present invention relates to a high-speed integrated circuit device and a method for manufacturing the same.

2. Description of the Related Art

Semiconductor integrated circuits have recently been making great progress in areas of operation speed and power consumption. Since their applications are wide and many, MOS semiconductor integrated circuits, especially BiCMOS semiconductor integrated circuits, are becoming increasingly important. Given this growing importance, a number of developments have occurred. For example, CMOS devices are miniaturized and their power supply voltage have decreased, bipolar transistors are also miniaturized and their parasitic resistance and parasitic capacitance are reduced by using a self-alignment technique, and many transistors have changed from conventional BJT (Bipolar Junction Transistors) using homojunction to HBT (Hetero Bipolar Transistors) using heterojunction. Furthermore, the gate electrode of a MOSFET (referred to as a MOS transistor) and the external base electrode of a bipolar transistor in a conventional CMOS (Complementary MOS) integrated circuit are formed of polysilicon. However, when an HBT having SiGe in its base electrode is used as a bipolar transistor, a low-temperature manufacturing process is required in order to prevent a hetero-epitaxial growing layer from being deformed. If polysilicon requiring a high-temperature manufacturing process is applied to a gate electrode of a MOS transistor or an external base electrode of a bipolar transistor, the degrees of freedom in the process is restricted and the process becomes complicated.

FIGS. 1 to 3 show an example of a manufacturing process for manufacturing a semiconductor integrated circuit device in which polysilicon is used for a gate electrode. This device comprises a P-type silicon (100) semiconductor substrate 1. A P-type epitaxial growing layer 5 is formed on the semiconductor substrate 1. An element isolating region having a deep trench-type element isolation insulating film 2 and a shallow trench-type element isolation insulating film 3 are each formed in respective regions of the semiconductor substrate 1, where a PMOS transistor and a bipolar transistor are formed, and where an NMOS transistor and a bipolar transistor are formed. These films 2 and 3 are constituted by, for example, a silicon oxide film, and polysilicon can often be buried into the deep film 2. The P-type epitaxial growing layers 5 corresponding to the regions (PMOS and bipolar forming regions) where the PMOS and bipolar transistors are formed, are N-type well regions, under which N+-type burying regions 4 are formed. One of the burying regions 4, which corresponds to the bipolar forming region, is connected to an N+-type diffusion region 6 which is exposed to the surface of the semiconductor substrate 1 and serves as a collector. P+-type source and drain regions 7 are formed in the PMOS forming region, and a polysilicon gate electrode 8 is formed above a region between the source and drain regions 7. A sidewall insulating film 9 such as a silicon oxide film is formed on the gate electrode 8, and a gate insulating film 12 is formed by thermal oxidation between the gate electrode 8 and the semiconductor substrate 1.

In the region (NMOS forming region) where the NMOS transistor is formed, N+-type source and drain regions 10 are formed. Further, a gate oxide film 12 is formed on a region between the source and drain regions 10, and a polysilicon gate electrode 8 having a sidewall insulating film 9 is formed on the gate oxide film 12. The gate electrode 8 is doped with impurities and heated at about 900° to 1000° C. to activate these impurities. P⁻-type impurity diffusion regions 11 are formed in contact with the P+-type source and drain regions 7, while N⁻-type impurity diffusion regions 13 are formed in contact with the N+-type source and drain regions 10. Both the regions 11 and 13 have an LDD structure (FIG. 1).

Subsequently, the surfaces of the NMOS and PMOS forming regions are coated with an insulating film 14 such as a silicon oxide film, and the bipolar transistor is formed in the bipolar forming region. A P-type internal base region 18 of single crystal SiGe, which is epitaxially grown and has a thickness of about 50 to 200 nm, is formed in a predetermined area of the bipolar forming region. The composition ratio of Ge to Si in the SiGe epitaxial growing layer of the internal base region 18 is arbitrary and can be represented as $Si_{1-x}Ge_x$. Taking into account of the matching of lattice of SiGe with the P-type silicon epitaxial growing layer 5 on which the SiGe epitaxial growing layer is formed would suggest that the value of x be set equal to about 0.1 to 0.2.

An insulating film 16 such as a silicon oxide film, and then a polysilicon film 17 are formed on the P-type internal base region 18 serving as an external base leading electrode. An opening is formed in an emitter forming region of the polysilicon film 17. After that, the surface of the bipolar forming region including the polysilicon film 17 and the like is coated with an insulating film 15 (FIG. 2). The insulating film 16 is then etched to form an opening of an emitter region. This opening and the surface of the insulating film 15 are doped with N-type impurities to form a polysilicon layer 21. Subsequently, the N-type impurities are diffused by RTA to form the emitter region in the P-type internal base region 18, and the polysilicon layer 21 then serves as an emitter electrode. Next, an insulating film 20 such as a silicon oxide film is formed so as to cover the surface of the emitter electrode 21, and necessary contact holes are formed in the emitter, base, and collector regions of the bipolar transistor. A wiring collector electrode C formed of, e.g., aluminum is connected to the N+-type diffusion region 6, a wiring base electrode B is connected to the external base leading electrode 17, and a wiring emitter electrode E is connected to the emitter electrode 21. Finally, metal wiring electrodes 19 formed of, e.g., aluminum are connected to the source and drain regions 7 and 10 of the respective NMOS and PMOS forming regions (FIG. 3).

SUMMARY OF THE INVENTION

In most conventional MOS semiconductor integrated circuit devices as described above, polysilicon or a composite formed of polysilicon and other conductive films is used for a gate electrode. Since, as shown in FIG. 6, its resistivity is relatively large, polysilicon is disadvantageous to high-speed operations of MOS transistors. Moreover, this high-speed deterring characteristic makes it difficult to use polysilicon for the external base electrode of a bipolar transistor. For example, a method of manufacturing a BiCMOS semiconductor integrated circuit having a conventional structure requires a high-temperature (about 900° to 1000° C.) process in order to activate impurities in the polysilicon. It is thus necessary to form a MOS transistor before a bipolar transistor can be formed. Forming the MOS transistor and bipolar transistor separately, however, lengthens the manufacturing process and reduces the efficiency thereof.

The present invention has been developed in consideration of the above situation. Its object, therefore, is to provide a MOS semiconductor integrated circuit device which operates at high speed and a method for manufacturing the same with high efficiency.

One feature of the present invention is that polysilicon SiGe is used for the gate electrode of a MOS transistor. Another feature thereof is that a SiGe epitaxial growing layer used for the base of a bipolar transistor of a BiCMOS integrated circuit is formed in a region on the semiconductor substrate to which a semiconductor layer is exposed, and at the same time, polysilicon SiGe is formed on the gate insulating film as a gate electrode of a MOS transistor of the BiCMOS.

According to a first aspect of the present invention, there is provided a semiconductor integrated circuit comprising a semiconductor substrate and a plurality of MOS field effect transistors. Each of the MOS field effect transistor is formed on a surface region of the semiconductor substrate and has source and drain regions, a gate insulating film formed on a region between the source and drain regions, and a gate electrode formed on the gate insulating film. The gate electrode includes a polycrystalline SiGe-mixed crystal whose composition ratio is expressed by $Si_{1-x}Ge_x$ ($1 > x > 0$). Further, all of the MOS field effect transistors have a CMOS structure. A bipolar transistor is formed on the semiconductor substrate and has a monocrystalline SiGe layer as a base region, on which is formed an external base leading electrode of a polycrystalline SiGe layer. In addition, a resistor of a polycrystalline SiGe layer is formed on the semiconductor substrate.

According to a second aspect of the present invention, there is provided a method for manufacturing a semiconductor integrated circuit, comprising the following steps: forming a gate insulating film on a MOS field effect transistor forming region of a semiconductor substrate; growing a SiGe layer on an entire surface of the semiconductor substrate to form a polycrystalline SiGe layer from a portion of the SiGe layer which is located on the gate insulating film, as well as to form a monocrystalline SiGe layer from a portion of the SiGe layer which is located on a bipolar transistor forming region of the semiconductor substrate and to which the semiconductor substrate is exposed; selectively etching the SiGe layer to form a gate insulating film on the MOS field transistor forming region, and a polycrystalline SiGe gate electrode on thereon, then forming a monocrystalline SiGe base region in the portion which is located on the bipolar transistor forming region and to which the semiconductor substrate is exposed; forming source and drain regions in the MOS field effect transistor forming region; forming an external base leading electrode of the polycrystalline SiGe layer in contact with the monocrystalline SiGe base region; and diffusing impurities into a surface region of the monocrystalline SiGe base region to form an emitter region.

According to a third aspect of the present invention, there is provided a method for manufacturing a semiconductor integrated circuit, comprising the following steps: forming a gate insulating film on a field effect transistor forming region of a semiconductor substrate; forming a monocrystalline SiGe base region in a portion which is located on a bipolar transistor forming region of the semiconductor substrate and to which the semiconductor substrate is exposed; forming a polycrystalline SiGe layer on the gate insulating film and on an entire surface of the semiconductor substrate including the monocrystalline SiGe base region; selectively etching the polycrystalline SiGe layer to form a polycrystalline SiGe gate electrode on the gate insulating film of the MOS field effect transistor forming region, as well as to form an external base leading electrode of the polycrystalline SiGe layer on the monocrystalline SiGe base region of the bipolar transistor forming region; forming source and drain regions in the MOS field effect transistor forming region; and diffusing impurities into a surface region of the monocrystalline SiGe base region to form an emitter region.

The resistivity of polycrystalline SiGe is lower than that of polysilicon, and the impurity activation rate thereof is high even when it is grown at a low temperature when the polycrystalline SiGe is used as a gate electrode of a MOS transistor and as a base leading electrode of a bipolar transistor, the parasitic resistance can be reduced and the operation speed of the transistor can be increased. Furthermore, since no high-temperature annealing is required, unlike with the conventional polysilicon, a MOS transistor and a bipolar transistor can be manufactured in a single process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 10 to 14 are cross-sectional views of a process of manufacturing the semiconductor integrated circuit device shown in FIG. 4;

FIG. 15 is a view showing a dependence of the resistivity of a SiGe growing layer of the device shown in FIGS. 4 and 5 upon the temperature of thermal treatment;

FIG. 16 is a graph showing a dependence of the sheet resistance of a polycrystalline SiGe layer of the device shown in FIGS. 4 and 5 upon the thickness thereof;

DETAILED DESCRIPTION OF THE PREFERRED EMBODIMENTS

Figure 1:
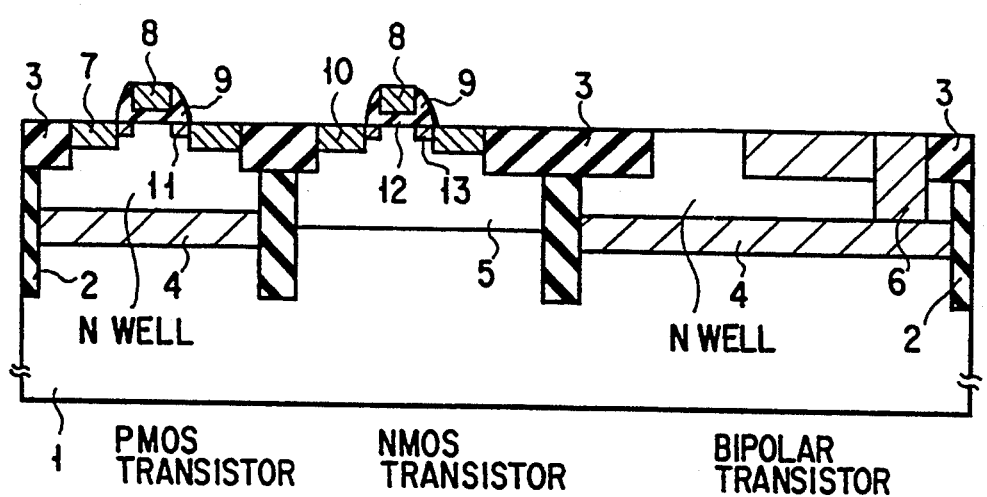
FIGS. 1 to 3 are cross-sectional views showing a process of manufacturing a conventional semiconductor integrated circuit device.
Figure 2:
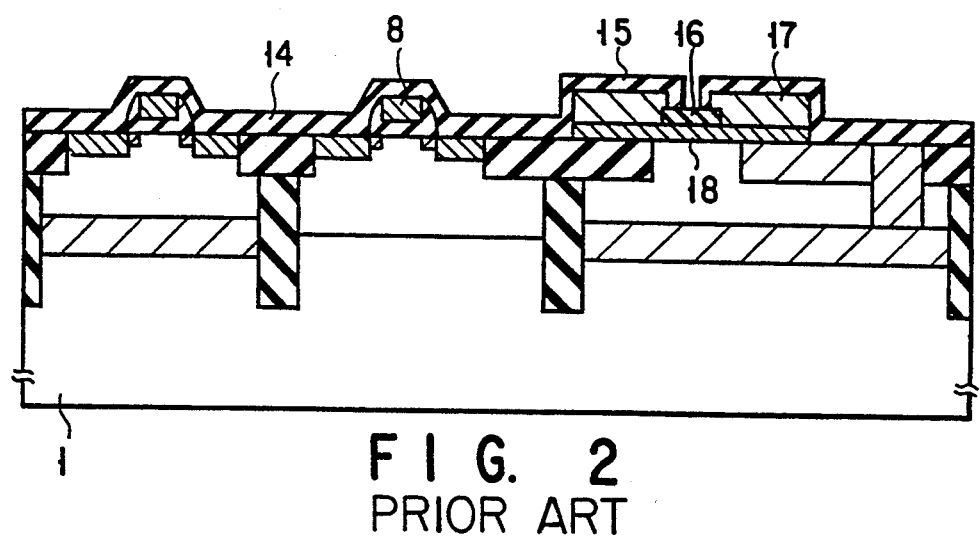
Figure 3:
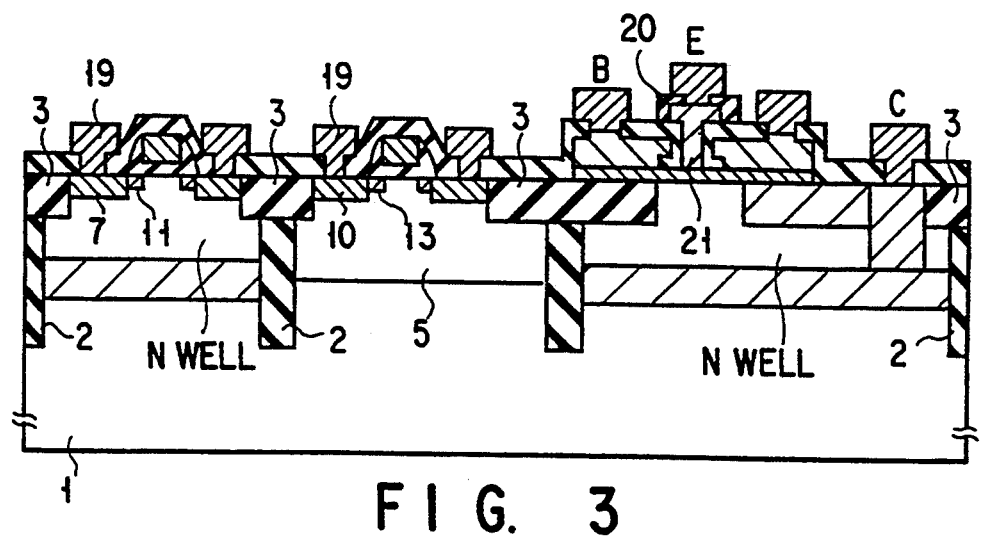
Figure 4:
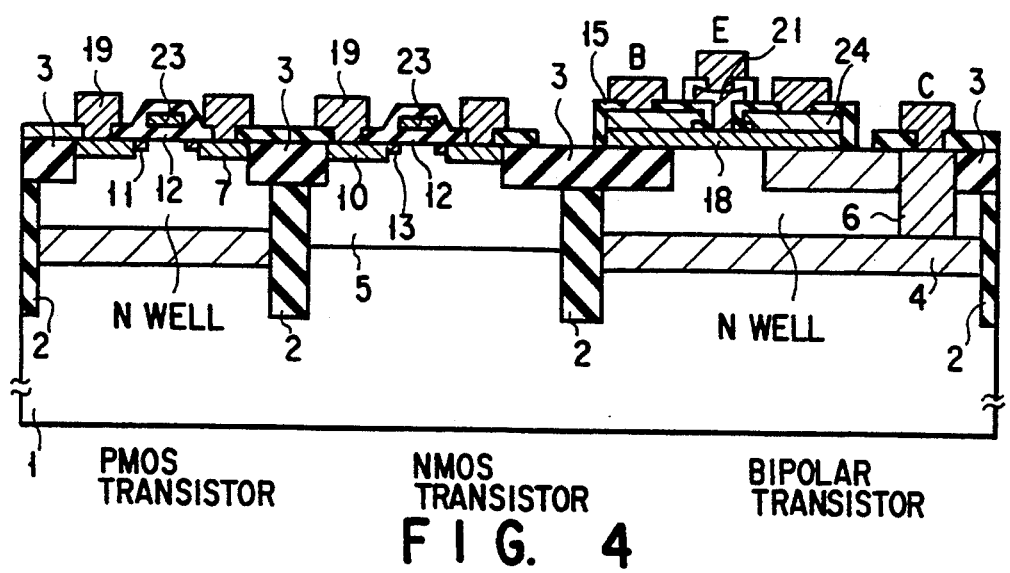
FIG. 4 is a cross-sectional view showing a semiconductor integrated circuit device according to a first embodiment of the present invention.
Figure 5:
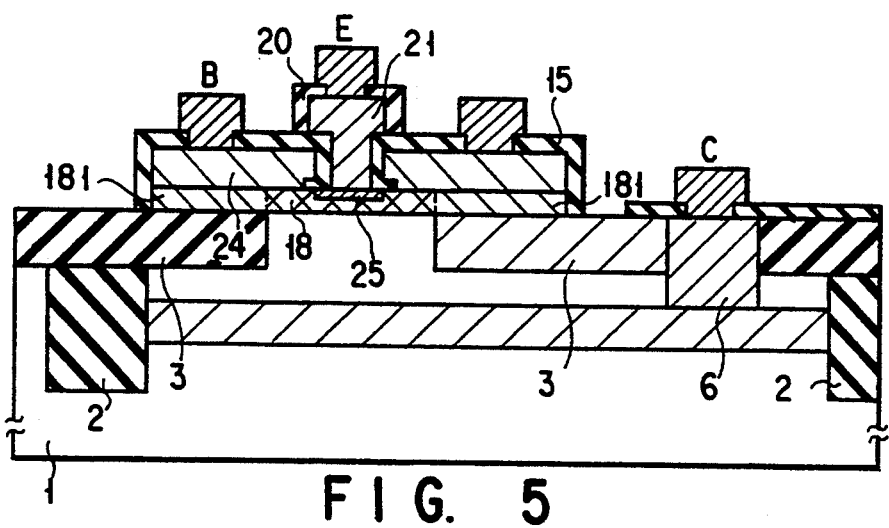
FIG. 5 is a partly enlarged cross-sectional view of the semiconductor integrated circuit device shown in FIG. 4.
Figure 6:
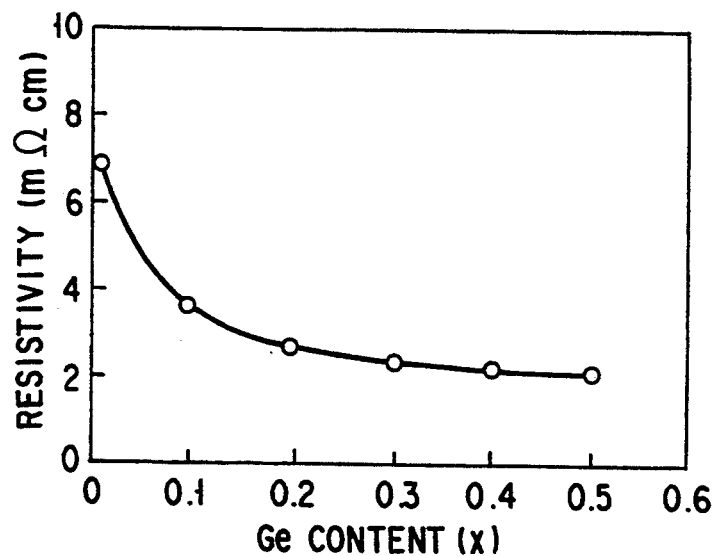
FIG. 6 is a graph showing a dependence of the resistivity of a SiGe growing layer of the device shown in FIGS. 4 and 5 upon the content of Ge.
Figure 7:
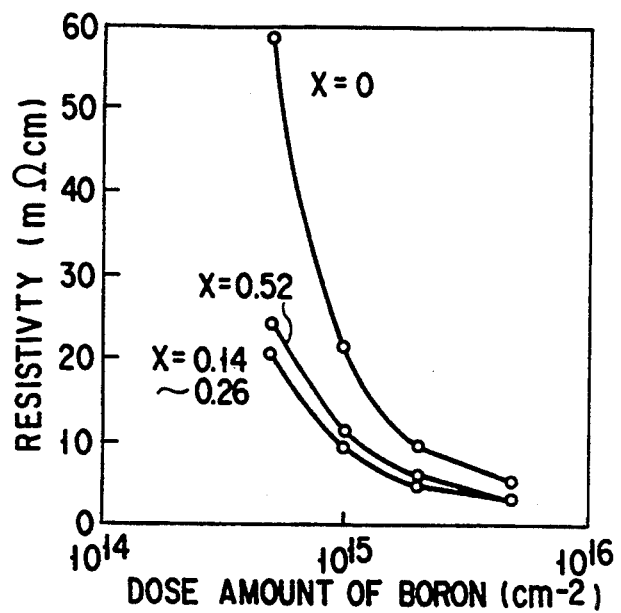
FIG. 7 is a graph showing a dependence of the resistivity of a SiGe growing layer of the device shown in FIGS. 4 and 5 upon the amount of impurities.
Figure 8:
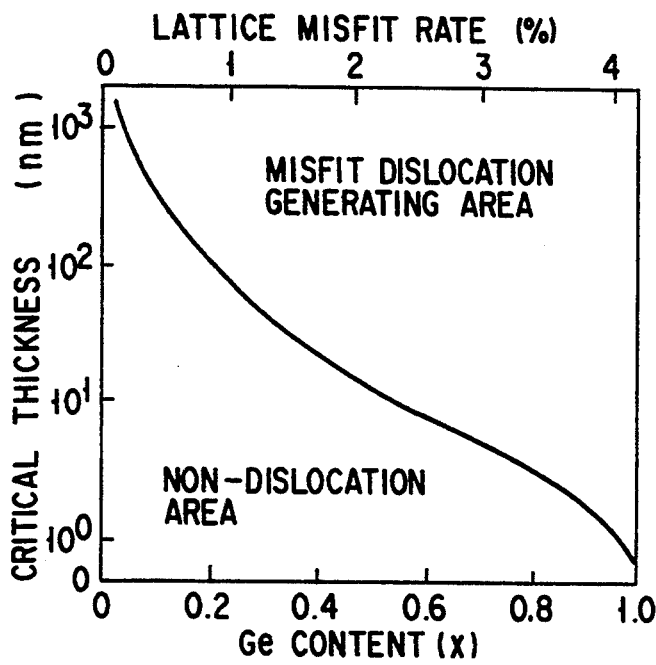
FIG. 8 is a graph showing a dependence of the critical thickness of a SiGe growing layer of the device shown in FIGS. 4 and 5 upon the content of Ge and the lattice misfit rate of the SiGe growing layer.
Figure 9:
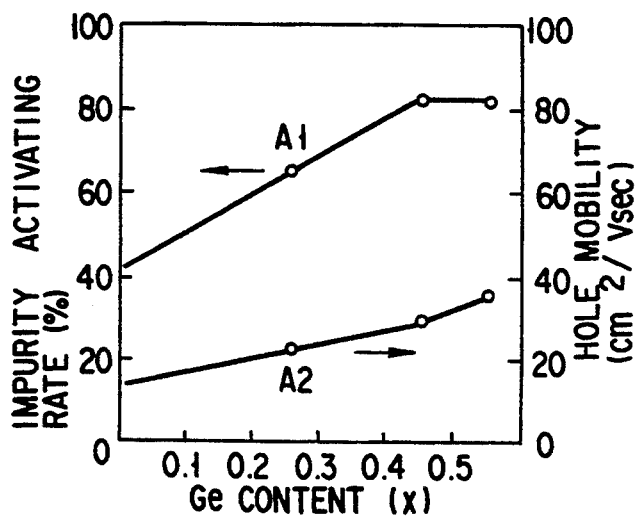
FIG. 9 is a graph showing an impurity activation rate of a SiGe growing layer of the device shown in FIGS. 4 and 5, and a dependence of the hole mobility thereof upon the content of Ge.

A first embodiment of the present invention will now be described, with reference to FIGS. 4 to 15. FIG. 4 is a cross-sectional view of a semiconductor integrated circuit device having a BiCMOS structure. FIG. 5 is a partly enlarged cross-sectional view of the device shown in FIG. 4. FIG. 6 is a graph showing a relationship between the content of Ge contained in an SiGe layer of the device shown in FIG. 4 and the resistivity of the SiGe layer. FIG. 7 is a graph showing a dependence of the resistivity of the SiGe layer upon the amount of B-ions to be implanted. FIG. 8 is a graph showing a dependence of the critical thickness of the SiGe layer upon the content of Ge. FIG. 9 is a graph showing an impurity activation rate of the SiGe layer and a dependence of the hole mobility upon the content of Ge. FIGS. 10 to 14 are cross-sectional views of a process of manufacturing the semiconductor integrated circuit device shown in FIG. 4. FIG. 15 is a graph showing a dependence of the resistivity of the SiGe layer doped with impurities upon the temperature of thermal treatment.

In the semiconductor integrated circuit device according to the first embodiment, a P-type silicon (100) semiconductor substrate 1 is used. A P-type silicon epitaxial growing layer 5 is formed on the semiconductor substrate 1. An element isolation region including both a deep trench-type element isolation insulating film 2 and a shallow trench-type element isolation insulating film 3 is formed between a PMOS element region and an NMOS element region and between an NMOS element region and a bipolar element region. The element isolation insulating films 2 and 3 are formed in the semiconductor substrate. They are constituted of, e.g., a silicon oxide film and polysilicon can often be buried into the deep trench-type element isolation insulating film 2.

P-type epitaxial growing layers 5 of the PMOS and bipolar element regions are both N-type well regions, under which N+-type burying regions 4 are formed. The burying region 4 of the bipolar element region is connected to an N+-type diffusion region 6, which serves as a collector and is exposed to the surface of the semiconductor substrate 1. P+-type source and drain regions 7 are formed in the PMOS element region, and a polysilicon SiGe gate electrode 23 is formed above a region between the source and drain regions 7. A sidewall insulating film of a silicon oxide film is formed on the gate electrode 23, and a gate insulating film 12 is formed by thermal oxidation between the gate electrode 23 and the semiconductor substrate 1. In the NMOS element region, N+-type source and drain regions 10 are formed. Further, a gate oxide film 12 is formed on a region between the source and drain regions 10, and a polysilicon SiGe gate electrode 23 having a sidewall insulating film is formed on the gate oxide film 12. The gate electrode 23 is doped with impurities and heated at about 800° C. to activate these impurities. P−-type impurity diffusion regions 11 are formed in contact with the P+-type source and drain regions 7, while N−-type impurity diffusion regions 13 are formed in contact with the N+-type source and drain regions 10. Both the regions 11 and 13 have an LDD structure.

In the PMOS and NMOS element regions, the surface of the semiconductor substrate is coated with an insulating film 14 such as a silicon oxide film. A single crystal SiGe film, which is epitaxially grown and has a thickness of about 50 to 200 nm, is formed as a P-type internal base region 18 in a predetermined area of the bipolar element region. This thickness is the same as that of the gate electrode 23 formed in each of the PMOS and NMOS element regions. The composition ratio of Ge to Si in the SiGe epitaxial growing layer of the internal base region 18 is arbitrary and can be represented as $Si_{1-x}Ge_x$. Taking into account of the matching of lattice of SiGe with the P-type silicon epitaxial growing layer 5 on which the SiGe epitaxial growing layer is formed would suggest that the value of x should be set equal to about 0.1 to 0.2. As shown in FIG. 6, if the value of x is smaller than 0.1, the resistivity of the SiGe growing layer is increased, and if x is larger than 0.2, the crystal lattices of SiGe and silicon are mismatched with each other, resulting in the tendency for a misfit dislocation to occur. In FIG. 6, the ordinate represents the resistivity (mΩ cm) of the SiGe epitaxial growing layer, and the abscissa indicates the content (x) of Ge in the SiGe epitaxial growing layer, which is represented by $Si_{1-x}Ge_x$. The thickness of the SiGe epitaxial growing layer is 300 nm, and the impurity (boron) concentration is about $1 \times 10^{20}$ cm$^{-3}$.

The internal base region 18 extends to the shallow trench-type element isolation region 3, as well as to the P-type silicon epitaxial growing layer 5 to which the bipolar element region is exposed. This is to make it easy for the internal base region 18 to contact an external circuit. Since the extension 181 of the internal base region 18 is grown on the insulating film 14, it is not monocrystallized but polycrystallized. Moreover, a polycrystalline SiGe film 24, which is thicker than the internal base region 18, is formed on the region 18 including the polycrystallized extension 181, and serves as an external base leading electrode. This polycrystalline SiGe film 24 can be monocrystallized if manufacturing conditions were varied. Since the emitter forming region of the polycrystalline SiGe film 24 has a contact hole, the internal base region 18 is partially exposed. The polycrystalline SiGe film 24 including the contact hole is then coated with an insulating film 15 such as a silicon oxide film, and the contact hole is filled with polysilicon 21 containing N-type impurities, thus contacting the exposed portion of the internal base region 18. This portion contacting the polysilicon 21 serves as an N-type emitter region 25, while the polysilicon 21 serves as an emitter electrode. The surface of the emitter electrode 21 is coated with an insulating film 20 such as a silicon oxide film.

In the emitter, base, and collector regions of the bipolar transistor, a wiring collector electrode C formed of, e.g., aluminum is connected to the N+-type diffusion region 6, a wiring base electrode B is connected to the external base leading electrode 24, and a wiring emitter electrode E is connected to the emitter electrode 21. The resistivity of the gate electrode 23 having the MOS structure is affected by its composition. As shown in FIG. 7, the resistivity of the gate electrode of SiGe is considerably lower than that of the gate electrode of silicon. In FIG. 7, the ordinate indicates the resistivity (mΩ cm) of the SiGe epitaxial growing layer, and the abscissa indicates the amount ($cm^{-2}$) of boron implanted into the SiGe epitaxial growing layer, which is represented by $Si_{1-x}Ge_x$. The curves shown in FIG. 7 represent four cases where the Ge content (x) of the SiGe epitaxial growing layer is 0 (silicon only), 0.14, 0.26, and 0.52. This data is obtained by executing RTA for thirty seconds at a temperature of about 900° C. As shown in FIG. 7, the resistivity decreases as the amount of implanted ions (boron) increases, or as the Ge content increases. This indicates that the resistance of the polycrystalline SiGe gate electrode can be kept lower than that of the conventional polysilicon gate electrode, and therefore, the SiGe gate electrode can be applied to an integrated circuit which operates at high speed.

In FIG. 8, the ordinate represents the critical thickness (nm) of the SiGe epitaxial growing layer, and the abscissa indicates the Ge content (x) of the SiGe epitaxial growing layer, which is represented by $Si_{1-x}Ge_x$. The silicon epitaxial growing layer (whose Ge content is 0) is not greatly influenced by its thickness. As the Ge content or the thickness of the epitaxial growing layer increases, it becomes difficult to prevent dislocation of crystal therein. In FIG. 8, the area formed under the critical curve represents a non-dislocation state in which the Ge epitaxial growing layer (whose Ge content is 1) is not epitaxially grown. This is due to the fact that in the non-dislocation state, the lattice misfit rate of the underlayer of silicon and the epitaxial growing layer is about 4%.

FIG. 9 is a graph which explains an effect of impurities such as boron (B) doped into the polycrystalline SiGe growing layer. In this figure, the ordinate indicates the activation rate (%) of boron doped into the polycrystalline SiGe growing layer and the hole mobility ($cm^2/Vs$) thereof, and the abscissa indicates the Ge content (x) of the SiGe epitaxial growing layer, which is represented by $Si_{1-x}Ge_x$. In FIG. 9, A1 is a variation curve indicative of the activation rate of boron, and A2 is a variation curve indicative of the hole mobility. As is apparent from these curves, the activation rate increases as the Ge content increases, and the hole mobility increases accordingly. A high-speed operation of the transistor can thus be expected.

A method for manufacturing the semiconductor integrated circuit device according to the first embodiment will now be described, with reference to FIGS. 10 to 15.

Figure 10:
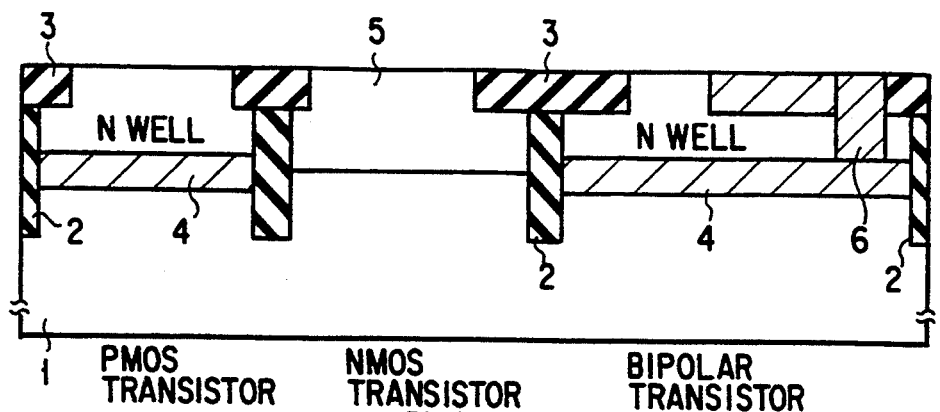

A P-type silicon (100) semiconductor substrate 1 is doped with N-type impurities such as phosphorus by, e.g., ion implantation to selectively form N+-type regions. A P-type silicon epitaxial growing layer 5 (referred to as an epitaxial growing layer hereinafter) is formed on the semiconductor substrate 1, and the N+-type regions are buried therein to form N+-type burying regions 4. N-type well regions are formed in the burying regions 4. Shallow and deep trenches are formed in the epitaxial growing layer 5 by anisotropic etching such as RIE (Reactive Ion Etching). These trenches are filled with insulating films of oxide silicon or the like to form a deep trench-type element isolation insulating film 2, which extends into the semiconductor substrate 1, and also a shallow trench-type element isolation insulating film 3. A PMOS element region and a bipolar element region are formed in the N-type well regions, and an NMOS element region is formed between them. An N+-type impurity diffusion region 6 (referred to as a collector diffusion region hereinafter), which serves as a collector and extends from the surface of the epitaxial growing layer 5 to the burying region 4, is formed in the bipolar element region (FIG. 10). Subsequently, gate insulating films 12 are formed on the surfaces of the PMOS element region, the NMOS element region, and the collector diffusion region 6 by, e.g., silicon oxidation. The surface of the bipolar element region is exposed. Next, an SiGe mixed-crystal layer 22 is grown unselectively on these regions.

Figure 11:
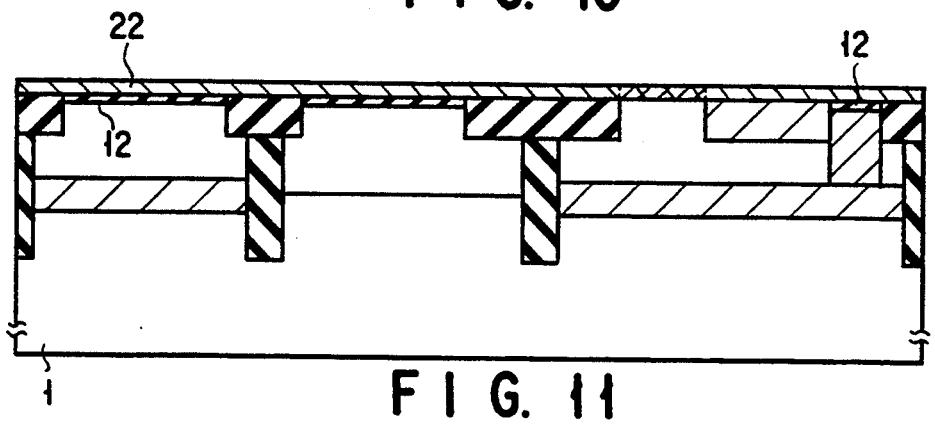

The mixed-crystal layer 22 includes boron doped at a concentration of about $1 \times 10^{19}$ $cm^{-3}$. Monocrystalline SiGe grows in that portion of the bipolar element region to which the surface of the epitaxial growing layer 5 is exposed, while polycrystalline SiGe grows on the insulating film 12. In order to form a SiGe growing layer 22, e.g., LPCVD (Low Pressure Chemical Vapor Deposition) is used. The semiconductor substrate is placed in a furnace heated under a pressure of about 0.1 to 1 Tort, and dichlosilane ($SiH_2Cl_2$) and germane ($GeH_4$) are supplied at a desired rate into the furnace with a carrier gas, with the result that a SiGe growing layer represented by $Si_{1-x}Ge_x$ is formed on the semiconductor substrate. 5 to 200 nm are suitable thicknesses for the SiGe growing layer. This layer can be formed by UHVCVD (Ultra High Vacuum CVD) under a pressure of about $10^{-8}$ Tort (FIG. 11). As described above, the SiGe growing layer 22 includes boron diffused therein at a high concentration by ion implantation or the like. The boron can also be doped by causing $B_2H_6$ to flow into the layer.

FIG. 15 shows a dependence of the resistivity of polycrystalline SiGe containing boron upon the temperature of thermal treatment for diffusing the boron. In FIG. 15, the ordinate represents the resistivity, and the abscissa indicates the temperature. As is apparent from this figure, the resistivity of the polycrystalline SiGe can be made lower than that of polysilicon (x=0) even when treated at a low temperature. The temperature at which the polycrystalline SiGe is treated can, therefore, be set at 800° C. or less.

Figure 12:
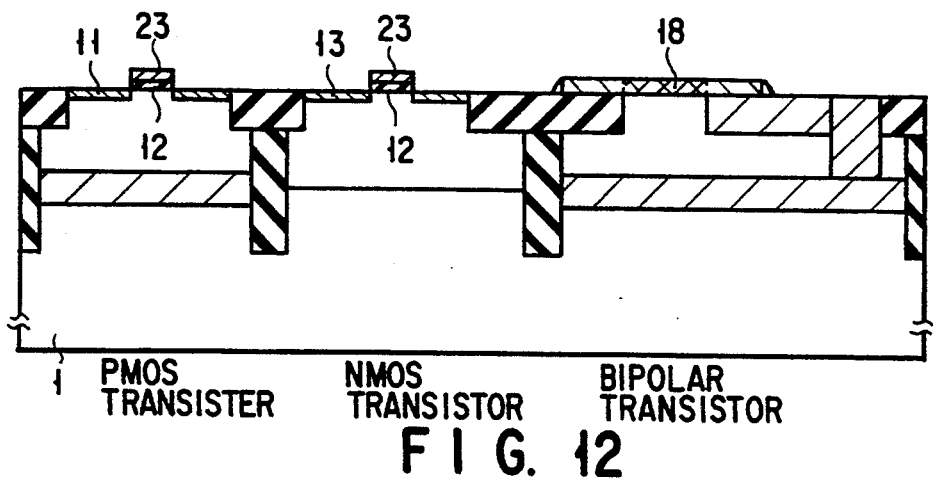

After that, the SiGe mixed-crystal layer 22 formed on the entire surface of the semiconductor substrate is processed by use of photolithography to form gate electrodes 23 in the PMOS and NMOS element regions and an internal base region 18 in the bipolar element region. Using these gate electrodes 23 as masks, an LDD P−-type diffusion regions 11 and an N−-type diffusion regions 13 are formed in the source and drain forming regions of PMOS and NMOS transistor, respectively. A polycrystalline region 181 (shown in FIG. 5) is formed in the shallow trench-type element isolation insulating film 3 of the internal base region 18 (FIG. 12).

Figure 13:
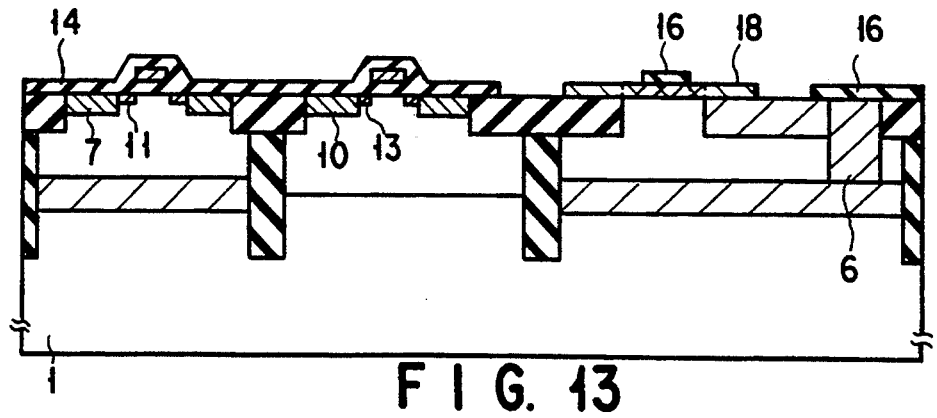

After an insulating film, such as a silicon oxide film and a silicon nitride film, is formed on the entire surface of the semiconductor substrate, the resultant structure is etched back to form oxide films on the side walls of the gate electrode 23 of each MOS element region. Using the gate electrode 23 as a mask, impurities are doped into the epitaxial growing layer 5 formed on the semiconductor substrate 1 by, e.g., ion implantation and then thermally diffused, thereby forming P-type source and drain regions 7 in the PMOS element region, as well as N-type source and drain regions 10 in the NMOS element region. Hence, insulating films 14 and 16 such as silicon oxide films are simultaneously formed on the MOS element region and on the internal base region 18 of the bipolar element region, respectively (FIG. 13).

Subsequently, a polycrystalline SiGe film 24, which is thicker than each of the internal base region 18 and the insulating film 16, is formed thereon by the above-described LPCVD, and serves as an external base leading electrode. A contact hole is formed in the polycrystalline SiGe film 24 to expose the insulating film 16, and the surface of the SiGe film is then coated with an insulating film 15, such as a silicon oxide film and a silicon nitride film (FIG. 14). The exposed insulating film 16 is removed by etching to open the emitter forming region of the internal base region 18, and a polysilicon layer 21 doped with high-concentration impurities is formed on the emitter forming region as an emitter electrode. After that, the N-type impurities of the polysilicon layer 21 are diffused into the internal base region 18, thus forming an emitter region 25. An insulating film 20, such as a silicon oxide film and a nitride film, is then formed so as to cover the surface of the emitter electrode. Contact holes are formed in the source and drain regions 7 and 10, the external base leading electrode 24, the collector diffusion region 6, and the insulating film covering the emitter electrode 21, thereby forming an emitter wiring electrode E, a base wiring electrode B, and a collector wiring electrode C in the NPN bipolar transistor, as well as a wiring electrode 19 in the source and drain regions 7 and 10 of the MOS transistor (see FIG. 4).

As described above, the internal base region of the NPN bipolar transistor and the gate electrodes of the MOS transistor are formed by the SiGe-mixed crystal. In addition, the internal base region of the PNP bipolar transistor and the gate electrodes of the MOS transistor can be formed by the SiGe-mixed crystal at the same time and, in this case, the polycrystalline SiGe used for the gate electrodes is doped with N-type impurities.

A second embodiment of the present invention will now be described, with reference to FIGS. 16 to 21.

FIG. 16 is a graph showing a dependence of the sheet resistance of a polycrystalline SiGe film upon the thickness thereof. In this figure, the ordinate represents the sheet resistance and the abscissa represents the thickness. As is apparent from FIG. 16, when the thickness is constant, the sheet resistance lowers as the concentration of impurities such as boron increases. In FIG. 16, lines D1, D2, and D3 indicate polycrystalline SiGe films having boron concentrations of $1 \times 10^{19}$ cm$^{-3}$, $1 \times 10^{20}$ cm$^{-3}$ and $1 \times 10^{21}$ cm$^{-3}$ respectively. The less the thickness, the higher the sheet resistance. In the first embodiment, the gate electrodes of the MOS transistor and the internal base region of the bipolar transistor are constituted of the same material, so the manufacturing process can be simplified. Since, however, the sheet resistance increases as the thickness decreases, the performance of the MOS transistor is lowered if the thickness of the SiGe film were decreased.

The high-speed operation of the bipolar transistor is inversely proportional to the square of the base width (i.e., the thickness of the internal base region 18), so the less the thickness, the higher the operation speed. A thickness reduction of the SiGe film therefore results in both the above-described advantage and disadvantage. In the second embodiment, this problem is solved by using different growing films, even in the gate electrode and internal base region which are made of the same SiGe material. Since the structures of the substrate and of the element isolation insulating film in the second embodiment are identical with those of the first embodiment which are shown in FIGS. 4 to 10, their descriptions are omitted.

Figure 17:
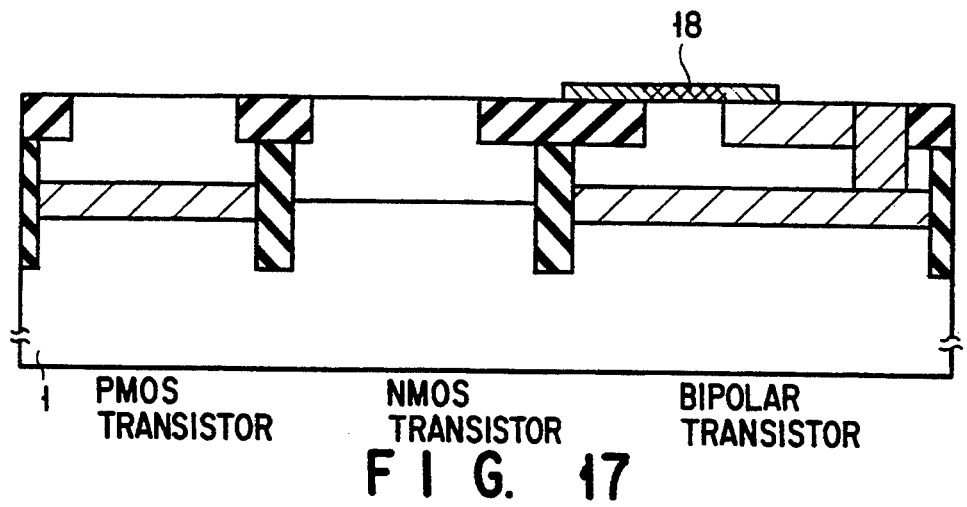
FIGS. 17 to 21 are cross-sectional views of a process of manufacturing a semiconductor integrated circuit device according to a second embodiment of the present invention.

A SiGe growing layer 18 serving as an internal base region is formed in a bipolar element region. This layer 18 is monocrystalline on the semiconductor substrate but polycrystalline on the shallow trench type element isolation insulating film 3. The thickness and the impurity concentration of the SiGe growing layer 18 are the same as those of the layer of the first embodiment (FIG. 17). After the formation of the SiGe growing layer, gate insulating films 12 are formed on NMOS and PMOS regions of the semiconductor substrate, and insulating films 16 for protecting the internal base region 18 are formed on the internal base region 18 and the collector diffusion region 6.

Figure 18:
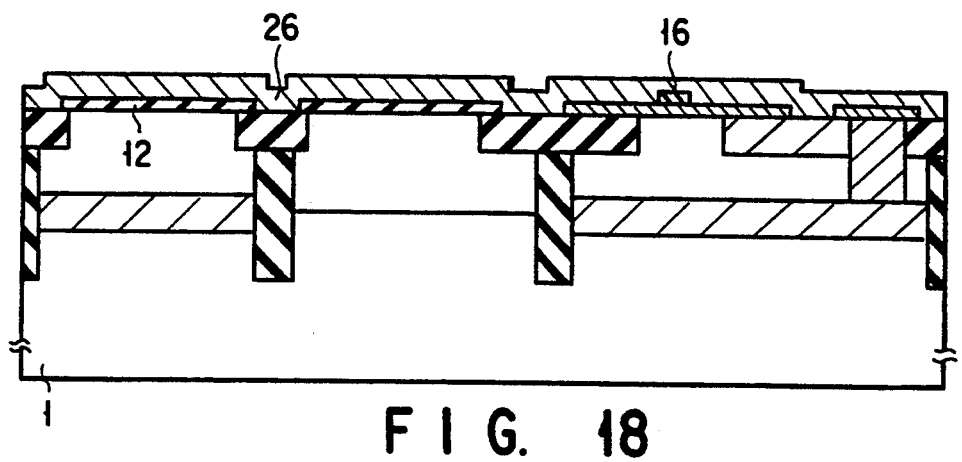
Figure 19:
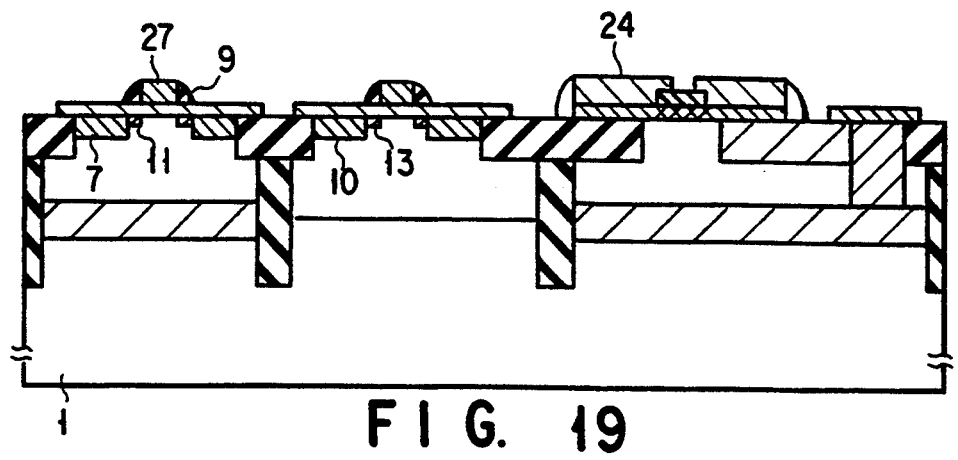
Figure 20:
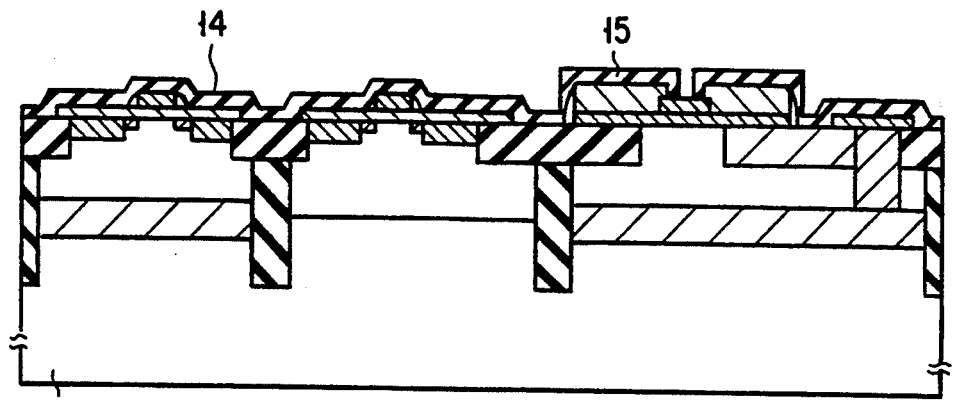

Then, a polycrystalline SiGe layer 26 containing P-type impurities of $1 \times 10^{20}$ cm$^{-3}$ or more is formed on the entire surface of the semiconductor substrate so as to contact the SiGe growing layer 18 (FIG. 18). The polycrystalline SiGe layer 26 is patterned using photolithography, thereby forming gate electrodes 27 of NMOS and PMOS transistors and an external base leading electrode 24 of the bipolar transistor. N$^-$-type regions 11 and 13 are attached to the source and drain regions 7 and 10 of the respective MOS transistors, in the same manner as that of the first embodiment, resulting in an LDD structure. Insulating films 9, such as a silicon oxide film and a nitride film, are formed on the side walls of each gate electrode. A contact hole contacting an emitter is formed in the external base leading electrode 24 to expose the insulating film 16 (FIG. 19). Subsequently, an insulating film 14 such as a silicon oxide film is formed in the MOS region, and an insulating film 15 such as a silicon oxide film is formed on the surface of the external base leading electrode 24 including the contact hole (FIG. 20). The exposed insulating film 16 is removed by etching to open the emitter forming region of the internal base region 18, and a polysilicon layer 21 doped with high-concentration N-type impurities is formed on the emitter forming region as an emitter electrode. After that, the N-type impurities of the polysilicon layer 21 are diffused into the internal base region 18 by RTA, thus forming an emitter region 25 (see FIG. 5).

Figure 21:
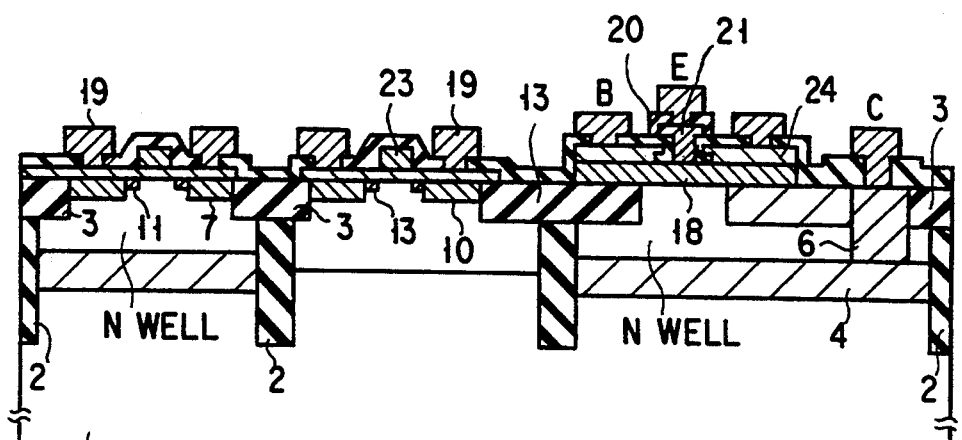

An insulating film 20, such as a silicon oxide film and a nitride film, is then formed so as to cover the surface of the emitter electrode. Contact holes are formed in the source and drain regions 7 and 10, the external base leading electrode 24, the collector diffusion region 6, and the insulating film covering the emitter electrode 21, thereby forming an emitter wiring electrode E, a base wiring electrode B, and a collector wiring electrode C in the NPN bipolar transistor, as well as a wiring electrode 19 in the source and drain regions 7 and 10 of the MOS transistors. The result is that an ultra-speed BiCMOS integrated circuit device is completed, with the gate electrode and internal base region having different thicknesses. (FIG. 21).

Figure 22:
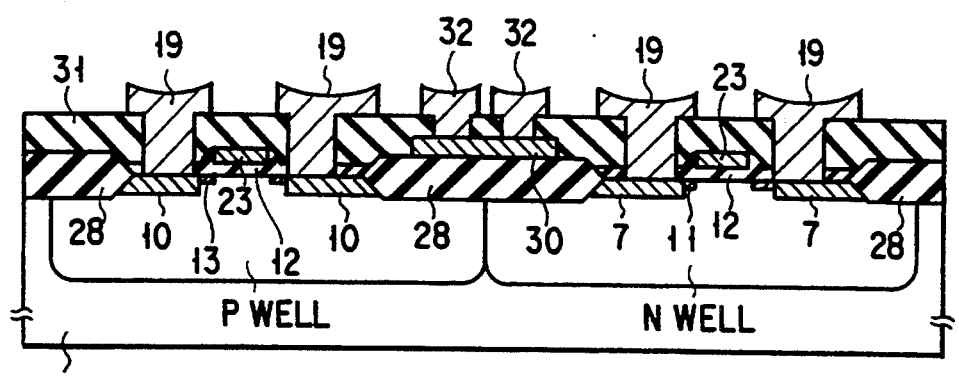
FIG. 22 is a cross-sectional view of a semiconductor integrated circuit device according to a third embodiment of the present invention.

A third embodiment of the present invention will now be described, with reference to FIG. 22.

Generally, a resistor of polysilicon or the like is employed in a semiconductor integrated circuit device having a high-precision analog circuit and a high-precision filter circuit. In the third embodiment, a polycrystalline SiGe layer is used in such a resistor, as well as in a gate electrode. A semiconductor substrate 1 is formed of N-type silicon and includes P- and N-type well regions. Gate oxide films 12 are formed on the P- and N-type well regions, and polycrystalline SiGe gate electrodes 23 are formed on the gate oxide films 12. In the third embodiment, an element isolation insulating film 28 formed by LOCOS (Local Oxidation of Silicon) is used in place of the trench-type element isolation insulating film described in the above embodiments. For example, silicon oxide films are formed as side walls of the gate electrodes 23.

While an NMOS transistor including source and drain regions 10 and $N^-$-type diffusion regions 13 having an LDD structure is formed in the P-type well region, a PMOS transistor including source and drain regions 7 and $N^-$-type diffusion regions 11 having an LDD structure is formed in the N-type well region. The resistor 30 used in the semiconductor integrated circuit device according to the third embodiment is formed on the element isolation insulating film 28 by, for example, the LOCOS. The material of the resistor 30, as is that of the gate electrode 23, is polycrystalline SiGe. The resistor and the gate electrode are formed by patterning the same growing layer. Needless to say, if the semiconductor integrated circuit device includes a bipolar transistor, the internal base region can be formed by a monocrystalline SiGe layer obtained from the growing layer of the gate electrode and resistor, and the external base leading region can be formed by a polycrystalline SiGe layer. The surface of the semiconductor substrate 1 is coated with an insulating film 31 such as a silicon oxide film. Contact holes are formed in the insulating film 31 to form wiring electrodes 19 of aluminum or the like contacting the source and drain regions 7 and 10, and to form wiring electrodes 32 of aluminum or the like contacting the resistor 30. The value of the resistor 30 can be lowered with high precision when the need arises. The resistivity of polycrystalline SiGe is $\frac{1}{2}$ to $\frac{1}{4}$ times as low as that of polysilicon.

In the above-described MOS transistors of the first to third embodiments, the gate electrode is formed of polycrystalline SiGe. However, it can be formed of a composite film which is constituted of a polycrystalline SiGe film and a silicide film of high melting-point metal, such as tungsten (W) or titanium (Ti), and whose resistance is controlled. Since the resistance can be decreased further, the operation speed of the semiconductor integrated circuit device can be increased.

Even though the polycrystalline SiGe is grown at a low temperature, its impurity activation rate is higher and its resistivity is lower than those of polysilicon. If the polycrystalline SiGe is used as a gate electrode of a MOS transistor and as a base leading electrode of a bipolar transistor, the parasitic resistance can be reduced and the operation speed of the transistor can be increased. Furthermore, since no high-temperature annealing is required, unlike with the conventional polysilicon, the manufacturing process can be shortened and its degrees of freedom can be improved as well.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A method for manufacturing a semiconductor integrated circuit, comprising the steps of:

forming a gate insulating film on a MOS field effect transistor forming region of a semiconductor substrate;

forming a monocrystalline SiGe base region in a portion which is located on a bipolar transistor forming region of said semiconductor substrate and to which said semiconductor substrate is exposed;

forming a polycrystalline SiGe layer on said gate insulating film and on an entire surface of said semiconductor substrate including said monocrystalline SiGe base region;

selectively etching said polycrystalline SiGe layer to form a polycrystalline SiGe gate electrode on the gate insulating film of said MOS field effect transistor forming region, as well as to form an external base leading electrode of the polycrystalline SiGe layer on said monocrystalline SiGe base region of said bipolar transistor forming region;

forming source and drain regions in said MOS field effect transistor forming region; and diffusing impurities into a surface region of said monocrystalline SiGe base region to form an emitter region.

2. A method for manufacturing a semiconductor integrated circuit, comprising the steps of:

forming an insulating film on a MOS field effect transistor forming region of a semiconductor substrate;

growing an SiGe layer on said insulating film and a bipolar transistor formation region of said semiconductor substrate, the portion of said SiGe layer located on said insulating film having a polycrystalline type and the portion of said SiGe layer contacted with said semiconductor substrate, which is a bipolar transistor forming region, having a monocrystalline type;

selectively etching said SiGe layer and said insulating film to form a gate insulating film and a gate electrode of said MOS field effect transistor and an internal base region of said bipolar transistor;

forming source and drain regions of said MOS field effect transistor forming region;

forming an external base leading electrode of a polycrystalline SiGe layer in contact with said internal base region; and diffusing impurities into a surface region of said internal base region to form an emitter region.

* * * * *